United States Patent
Hong et al.

(10) Patent No.: US 6,981,309 B2
(45) Date of Patent: Jan. 3, 2006

(54) METHOD FOR PRODUCING (NB, TI)$_3$SN WIRE BY USE OF TI SOURCE RODS

(75) Inventors: Seung Hong, New Providence, NJ (US); Jeff Parrell, Roselle Park, NJ (US); Michael Field, Jersey City, NJ (US)

(73) Assignee: Oxford Superconducting Technology, Carteret, NJ (US)

( * ) Notice: Subject to any disclaimer, the term of this patent is extended or adjusted under 35 U.S.C. 154(b) by 0 days.

(21) Appl. No.: 10/963,972

(22) Filed: Oct. 13, 2004

(65) Prior Publication Data

US 2005/0178472 A1  Aug. 18, 2005

Related U.S. Application Data

(60) Provisional application No. 60/512,354, filed on Oct. 17, 2003.

(51) Int. Cl.
*H01L 39/24* (2006.01)
(52) U.S. Cl. .................. 29/599; 29/825; 174/125.1; 505/928; 505/930
(58) Field of Classification Search ............ 29/599, 29/825; 174/125.1; 505/928, 930
See application file for complete search history.

(56) References Cited

U.S. PATENT DOCUMENTS

| | | | |
|---|---|---|---|
| 3,743,986 A * | 7/1973 | McInturff et al. ........... 335/216 |
| 4,385,942 A | 5/1983 | Takikawa et al. | |
| 4,646,428 A * | 3/1987 | Marancik et al. ............ 29/599 |
| 4,776,899 A * | 10/1988 | Murase et al. ................ 148/98 |
| 4,803,310 A * | 2/1989 | Zeitlin et al. ........... 174/125.1 |
| 4,917,965 A * | 4/1990 | Inoue et al. ................ 428/614 |
| 5,127,149 A * | 7/1992 | Ozeryansky ................ 29/599 |
| 5,534,219 A | 7/1996 | Marancik et al. | |
| 5,554,448 A * | 9/1996 | Yamada et al. ............. 428/612 |
| 6,251,529 B1 | 6/2001 | Kubo | |
| 6,436,554 B2 | 8/2002 | Kubo | |
| 6,543,123 B1 * | 4/2003 | Wong .......................... 29/599 |
| 6,836,955 B2 * | 1/2005 | Wong .......................... 29/599 |
| 6,918,172 B2 * | 7/2005 | Wong .......................... 29/599 |

OTHER PUBLICATIONS

O. Kohno et al., Ti added Nb3Sn Wires by New Fabrication Processes, IEEE Transactions on Magnetics, vol. Mag. 23, No. 2, Mar.. 1987.

A. Nikulin et al., The Investigation of the Effect of Niobium Artificial Doping With Titanium on Nb3Sn Superconductors Properties, Advances in Ctyogenic Engineering, vol. 42, Plenium Press, New York 1996.

A.K. Shikov, Improvements of (NbTi)3 Sn Bronze Processed Superconducting Performance, IEEE Transactions on Applied Superconductivity, vol. 9, No. 2, Jun. 1999.

* cited by examiner

*Primary Examiner*—Carl J. Arbes
(74) *Attorney, Agent, or Firm*—Klauber & Jackson (57) ABSTRACT

An improvement is disclosed in the method for producing a multifilament (Nb, Ti)$_3$Sn superconducting wire by the steps of preparing a plurality of Nb or Nb alloy rods where Nb or Nb alloy monofilaments are encased in copper or copper alloy sheaths; packing the Nb or Nb alloy rods within a copper containing matrix to form a packed subelement for the superconducting wire; providing sources of Sn, and sources of Ti within said subelement; assembling the subelements within a further copper containing matrix; and diffusing the Sn and Ti into the Nb or Nb alloy rods to form (Nb, Ti)$_3$Sn. The method is improved by diffusing the Ti into the Nb from a minor number of Ti dopant source rods which are distributed among the Nb or Nb alloy rods.

22 Claims, 8 Drawing Sheets

METHOD FOR PRODUCING (NB, TI)₃SN WIRE BY USE OF TI SOURCE RODS

RELATED APPLICATION

This application claims priority from U.S. Provisional Application No. 60/512,354 filed Oct. 17, 2003.

FIELD OF THE INVENTION

This invention relates generally to methods for preparing superconductive wires and cables, and more specifically relates to a method for preparation of $(Nb,Ti)_3Sn$.

BACKGROUND OF THE INVENTION

The addition of Ti or Ta to $Nb_3Sn$ is required to obtain the highest $B_{c2}$ (upper critical field) and highest critical currents at high (~>12T) magnetic fields. $(Nb, Ti)_3Sn$ has lower AC losses than the alternative $(Nb, Ta)_3Sn$ material, therefore making it an appealing source for superconducting magnet makers concerned with rapidly changing magnetic fields. $(Nb, Ti)_3Sn$ also has better strain tolerance than $(Nb, Ta)_3Sn$ making it more useful in high stress magnet designs. $(Nb, Ta)_3Sn$ composites are commonly made with Nb7.5 wt % Ta filaments, which are harder than the pure Nb filaments used in $(Nb, Ti)_3Sn$ composites and thus more difficult to fabricate.

The present most common method for adding Ti to internal tin wire is by use of a Sn—Ti alloy. During heat treatment, the Ti in the Sn diffuses with the Sn through the Cu matrix of the composite wire to react with the Nb filaments and form the necessary high $B_{c2}$ phase. However several problems arise in use of this conventional Sn—Ti alloy approach. One problem is that hard, rod shaped Sn—Ti intermetallic particles of dimensions ~25 μm diameter by ~100 μm long are unavoidably formed during the casting of the Sn—Ti alloy. These intermetallic particles break filaments (and eventually the wire) during fabrication when their dimension becomes comparable with the tin reservoir dimension. The consequence is that the minimum diameter of the wire or the elements used in the wire is limited. Furthermore the Sn—Ti alloy is difficult and expensive to produce. Quality control is also an issue, which is especially problematic in light of the volumes of alloy that would be required to fulfill the wire orders for next generation fusion magnets.

Another method of Ti addition to internal tin or bronze process wire is to use a Ti or Nb—Ti rod in the center of each of the Nb filaments, so that the Ti diffuses from the center of each filament during heat treatment. The problem with this method is that it indeed requires every filament to have a Ti or Nb—Ti source in its center, which is prohibitively expensive.

Yet another method of Ti addition to bronze process wire is to use a Cu—Sn—Ti alloy matrix instead of Cu—Sn. The problem with this method is that is difficult to fabricate without cracking.

SUMMARY OF THE INVENTION

The present invention overcomes all of the problems indicated above. In accordance with the present invention Nb—Ti alloy or Ti rods (herein referred to as "Ti dopant source" rods) are distributed among rods of Nb or a Nb alloy with at least some Cu or Cu alloy intervening between rods. The number of Ti dopant source rods is small compared to the number of Nb or Nb alloy rods, and the dopant source rods are preferably symmetrically distributed among the more numerous Nb or Nb alloy rods. The invention can be used with the bronze process for $Nb_3Sn$ production, but is particularly applicable where the internal tin process is used. In one preferred embodiment Nb (or Nb alloy) rods are distributed in a matrix of Cu surrounding a pure Sn or SnCu alloy core and this subelement for the final multifilament wire is surrounded by a Ta or Nb or Nb alloy diffusion barrier. As will be further evident in the following, the term "subelement" refers to the subassembly which when tightly grouped (packed) with like subassemblies forms a precursor assembly for the final superconductor wire. The Ti dopant source rods in the subelement are evenly and symmetrically arranged amongst the Nb (or Nb alloy rods). Where the rods comprise Nb alloy, such alloy is comprised of not less than 70 wt % Nb. The possible concentration range for Ti in the Ti dopant source rods is from about 10 to 100% by weight. Particularly useful because of good ductility and ready commercial availability are Ti dopant source rods formed of the Nb47 wt % Ti alloy. The Ti from the Ti dopant source rods diffuses during heat-treatment from the Ti dopant source rods to the surrounding Nb or Nb alloy rods with the assistance of the Sn diffusion and the high diffusion rate of Ti through Cu—Sn alloy. The design of the exact volume ratio of Ti dopant source rods to Nb (or Nb alloy) rods is determined by the wt % of Ti in the Ti dopant source rods, the volume of Nb or Nb alloy rods, and the desired final Ti doping concentration. The Ti dopant source rods should be protected by a Nb diffusion barrier to prevent Cu—Ti intermetallic particle formation during process steps. A beneficial side effect of the Ti diffusion is that at the reaction stage the Ti source rods are replaced with Cu, which suggests designs (e.g. spokes of Ti source rods) of the subelement where the Ti source rods could act to subdivide superconducting regions, thereby reducing the effective filament diameter and AC losses.

BRIEF DESCRIPTION OF DRAWINGS

The invention is diagrammatically illustrated, by way of example, in the drawings appended hereto, in which.

DESCRIPTION OF PREFERRED EMBODIMENT

The process of the present invention can be used in the full range of A15 type superconductor billet design including internal tin and bronze process methods. In accordance with the invention a method is provided for producing a multifilamentary (Nb, Ti)$_3$ Sn superconducting wire. In the method a plurality of Nb or Nb alloy rods are packed within a copper containing matrix to form a packed subelement for the superconducting wire. Ti dopant source rods are packed amongst the Nb or Nb alloy rods in the copper containing matrix, and sources of Sn are provided within the subelement, or arranged adjacent to the subelement. The subelements are assembled within a further copper containing matrix, with one or many diffusion barriers between the precursors for the superconductor and this stabilizing copper; and the assemblage is reduced to wire form. The Sn and the Ti are then diffused into the Nb or Nb alloy rods to form (Nb, Ti)$_3$ Sn by appropriate thermal treatment.

Figure 1:
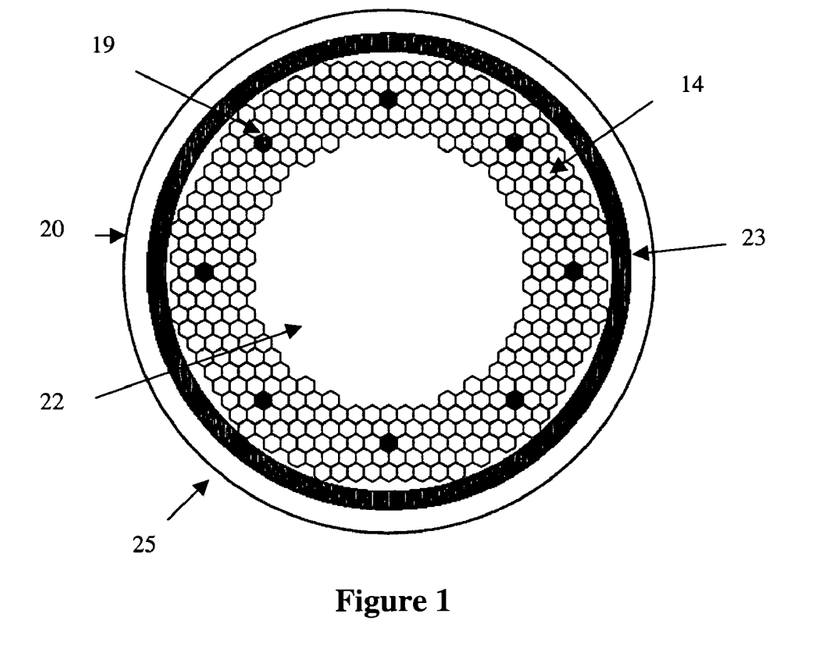
FIG. 1 is a schematic diagram illustrating the present invention being used in preparing a composite superconductor wire by the internal tin process.
Figure 1A:
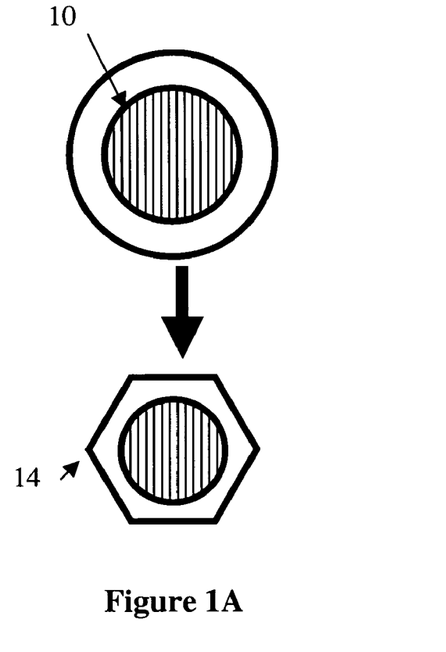
Figure 1B:
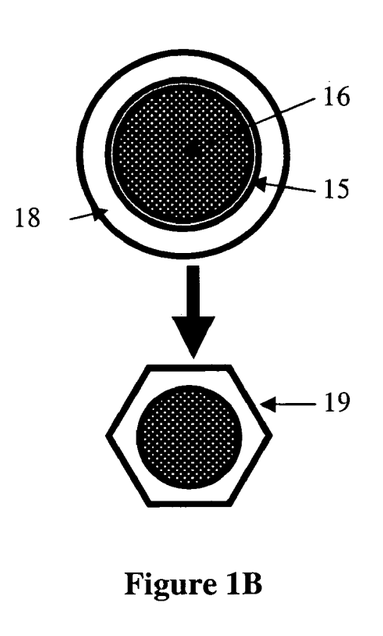
Figure 1C:
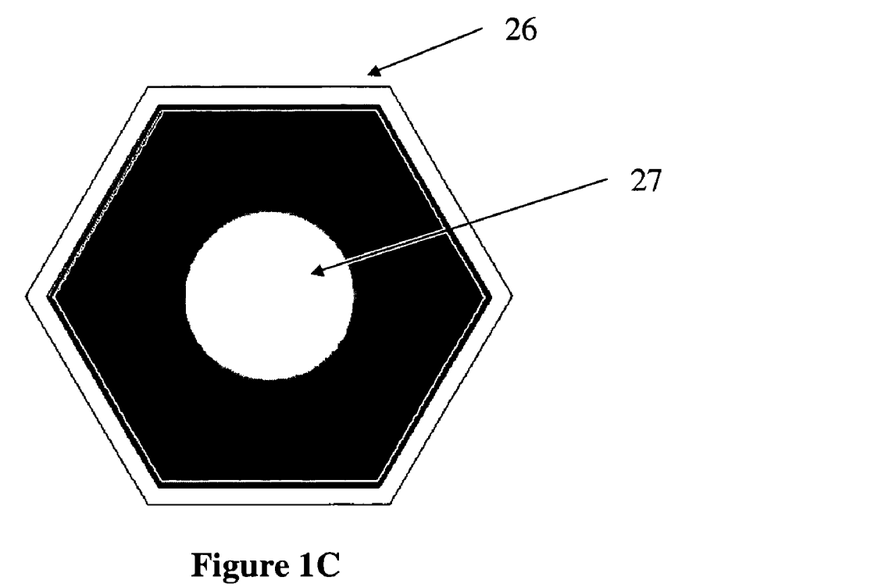
Figure 1D:
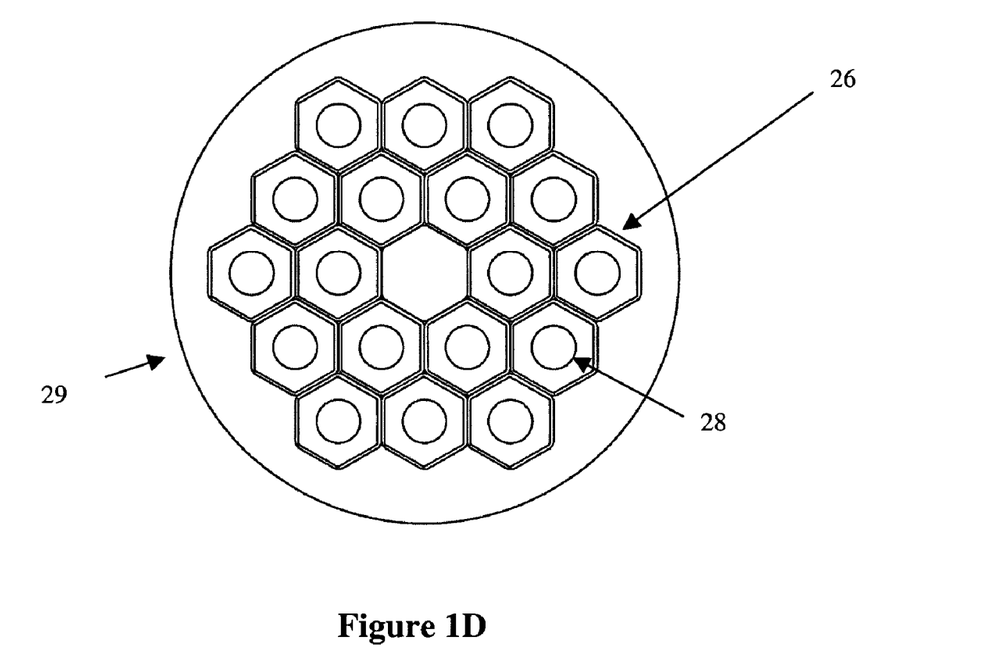

In FIG. 1 a schematic diagram illustrates the invention being used in preparing a multifilament superconductor wire by the internal tin process. Key to any internal tin billet is the design of the subelement, where the metal ratios and shape of the filaments is set. One common approach is to extrude monofilaments of Nb or Nb alloy clad with copper or copper alloy, hex and cut these monofilaments for packing in a hexagonal restack to form the subelement billet, typical for high current density wire designs. This approach is used in FIG. 1. Another common method for forming the subelement billet is to drill a copper or copper alloy billet matrix with holes and fill the holes with round Nb alloy rods, typical for wire designs of moderate current density with low AC losses, e.g. wire for ITER (International Thermonuclear Experimental Reactor) TF (Toroidal Field) and CS (Central Solenoid) coils. This approach is used in the method illustrated in FIG. 2. The present invention is suitable for use with both of these common types of subelement, as well as with any type of internal tin style subelement with Nb or Nb alloy filaments.

Referring then to FIG. 1($a$1) an Nb or Nb alloy (e.g. Nb7.5% Ta, Nb1% Zr) monofilament 10 is encased with a sheath of copper or copper alloy 12. The Cu encased Nb monofilament is drawn to a rod 14 with a hexagonal ("hex") cross section. Similarly in FIG. 1($a$2) a Ti or Ti alloy (e.g., Nb47% Ti, Nb50% Ti) monofilament 16 encased with a Nb diffusion barrier 15 (to prevent Cu—Ti formation in subsequent processing steps by the copper reacting with the Ti core) and a Cu or Cu alloy (e.g. Cu0.7% Sn, oxide dispersion strengthened Cu—Al$_2$O$_3$) sheath 18 is formed to a rod 19 with a hex cross section. The hexed rods 14 and 19 are restacked in a shaped or machined copper can 20 with the central copper matrix 22 formed by copper hexes or from a piece of bulk copper and a Nb alloy diffusion barrier 23 (to limit tin diffusion during the reaction sequences) is provided between the hexes and copper can 20. The choice of the diffusion barrier 23, Ta, Nb, or some similar alloy known to be useful for such barrier, depends on the final application, but does not appreciably alter the embodiments of this invention. The barrier may be in tube or wrapped sheet form. However, if a reactable barrier is chosen (e.g., Nb), the area of this reactable barrier must be taken into consideration when determining the amount and distribution of Nb—Ti alloy. A symmetrical even spacing of the Ti dopant source rods 19 throughout the Nb rods 14 is preferred in order to increase the effectiveness of final diffusion. The number of Ti dopant source rods is determined by the composition of the Ti alloy rods, the relative number and size of the Nb and Ti dopant source rods and the desired final Ti concentration. The best superconducting properties for (Nb, Ti)$_3$Sn have been shown in the literature to be associated with about 0.5–3.0 atomic weight % Ti.

Once the subelement 25 of FIG. 1($b$) is extruded the type of final restack method must be chosen. Restacking is generally (but not always) needed to help reduce the subelement and thus filaments to a small enough dimension for effective diffusion and reaction, and/or to add a diffusion barrier. The two basic techniques are "hot" and "cold" restacking. The "hot" method involves the final restack being reduced initially by hot extrusion to aid in metallurgical bonding between the subelements and copper matrix, and this method has been referred to in the literature as "Hot Extruded Rod". The "cold" method involves the final restack being reduced by only cold wire drawing techniques (the disadvantage is less bonding, the advantage is simplicity), and this method has been referred to in the literature as "Restack Rod Process". To restack via the "hot" method, subelement 25 is drawn and formed into a hex as in FIG. 1($c$) and a hole 27 is formed by gundrilling or other suitable means. The hole 27 is filled with salt as is known in the art, the restack 29 of subelements and copper can is packed, evacuated, welded and hot extruded, and then the salt is subsequently removed from the holes 28 and replaced by Sn or Sn alloy as at the composite wire assembly 29 in 1($d$). To restack via the "cold" method, the extruded subelement 25 is gundrilled in the center region 22 and packed with tin or tin alloy. The subelement is reduced, restacked (as in a pattern in 29 of 1($d$)) and cold drawn to final wire size.

Once the wire has been processed to final size, a heat treatment is used to diffuse the Sn and Ti to the Nb and create the superconductor phase. The composite structure 29 of FIG. 1($d$) including a plurality of packed and hexed subelements 26 in a Cu matrix is thus subsequently subjected to a heating schedule to diffuse the Sn and Ti through the Cu into the Nb monofilaments to produce the superconductor. Typically for internal tin there are some pre-reaction sequences between 180° C.–570° C. on the order of tens to hundreds of hours that diffuse the tin throughout the matrix forming high wt % Sn bronze phases. This is then followed by a reaction stage 600° C.–725° C. for tens to hundreds of hours to form the A15 phase (Nb, Ti)$_3$Sn. It will be further appreciated that where the majority Nb alloy rod or diffusion barrier used is Nb—Ta (e.g., Nb7.5 wt % Ta), it is then possible to form (Nb, Ta, Ti)$_3$Sn through this technique.

Figure 2:
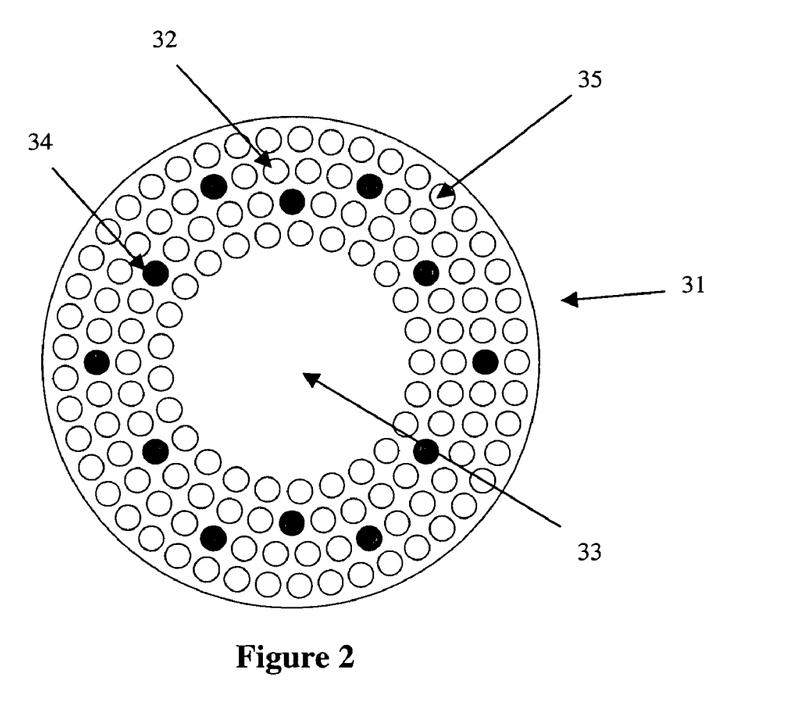
FIG. 2 is a schematic diagram illustrating the present invention being used in preparing a further composite superconductor wire by the internal tin process.
Figure 2A:
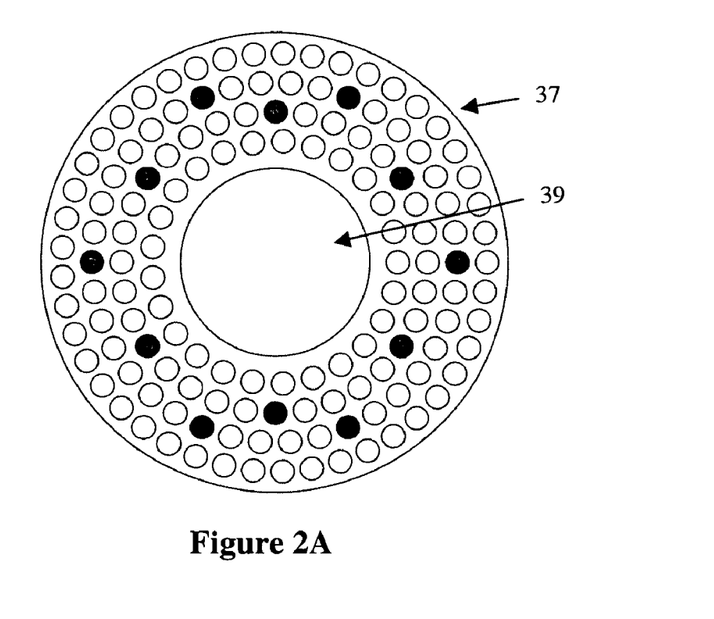
Figure 2B:
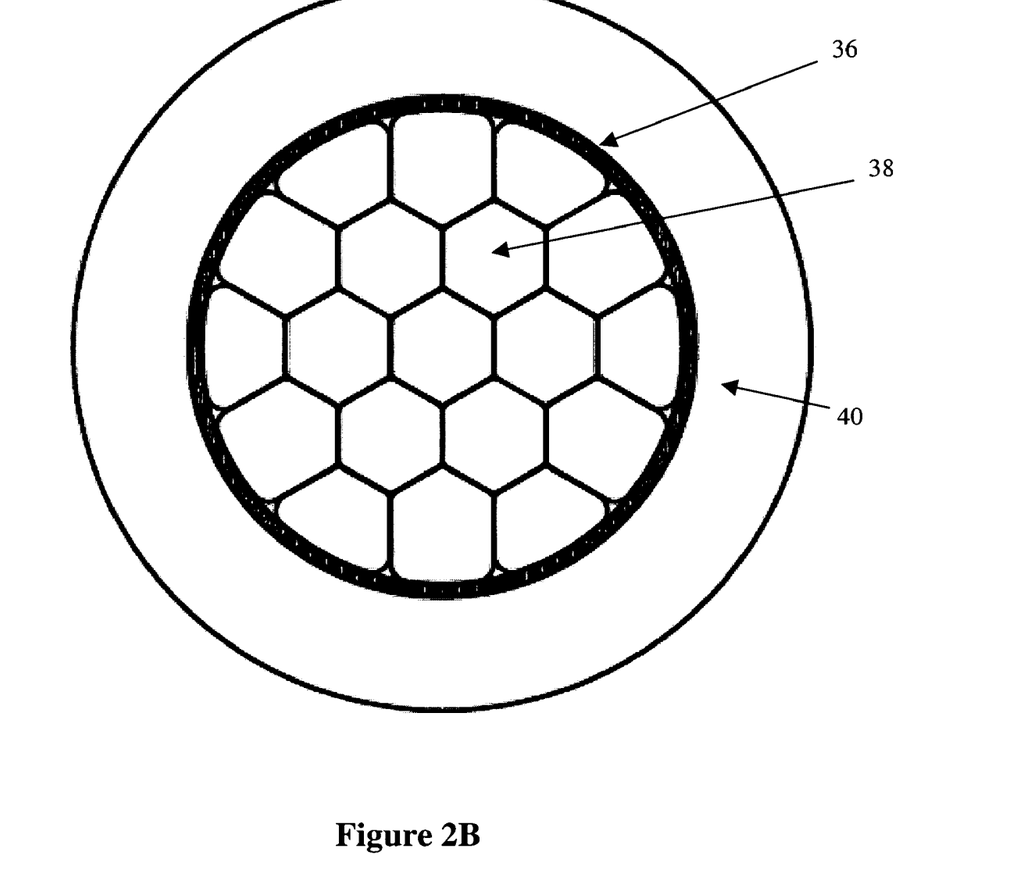

FIG. 2 illustrates use of the invention in a variation of the internal tin process. In FIG. 2($a$) gundrilled holes 35 in the copper billet 31 are filled with majority Nb alloy rods 32 with minority Ti dopant source rods 34 being symmetrically spaced among the rods 32. The rods 32 need not have any copper cladding but rods 34 are similar to those in FIG. 1($a$2) in that they must be encased in a Nb diffusion barrier. In FIG. 2($b$) a Sn or Sn alloy 39 is inserted at the gundrilled center 33 of the subelement 37, which is subsequently drawn and shaped to repacking size. At FIG. 2($c$) the shaped subelements 38 are packed in a Ta diffusion barrier 36 within copper tube 40 and drawn to final wire size, with subsequent heat processing to effect diffusion as described above.

While the Sn source has been mainly described as being within the subelements, it is also possible to use a not-as-common technique where Sn can in addition be placed alongside the subelements so long as the subelement+tin is inside the diffusion barrier. Thus in FIG. 2$c$. a number of additional Sn regions can be provided adjacent to the subelements but inside the diffusion barrier. The tin within the subelements can in principle even be reduced to zero with the tin adjacent to the subelements being increased further to compensate.

Figure 3:
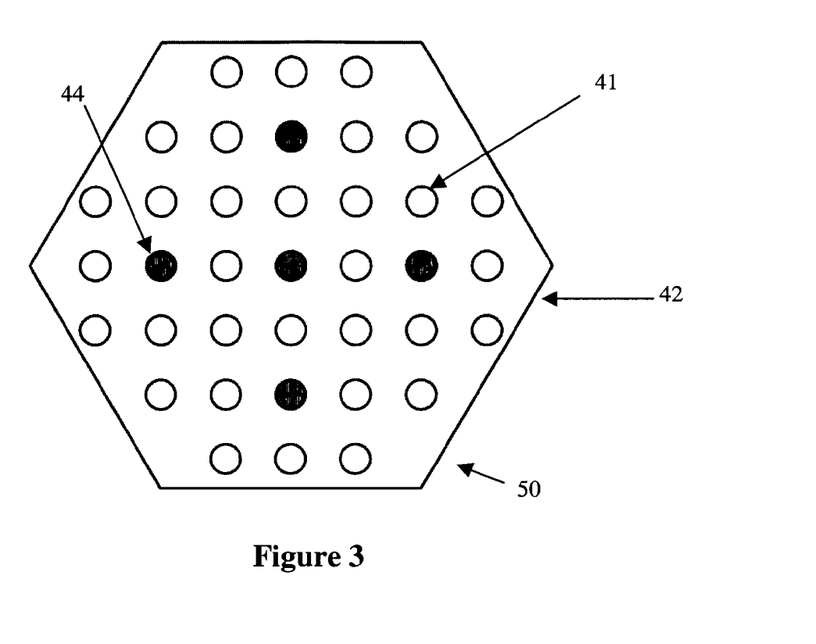
FIG. 3 is a schematic diagram illustrating several extrusion steps for an embodiment in which the present invention is used in preparing a superconductor wire by the bronze process.
Figure 3A:
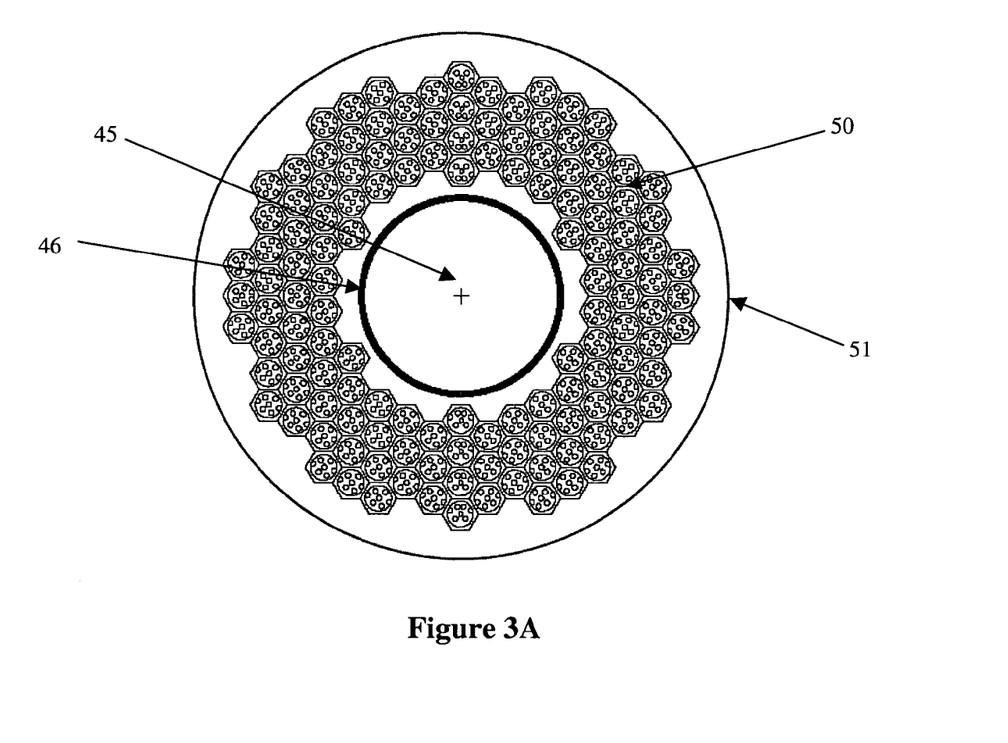

In FIG. 3 the method of the invention is used in the "bronze process". In a first extrusion as in FIG. 3(a), Nb alloy rods 41 are in a matrix 42 of alpha phase Cu—Sn alloy. Ti dopant source rods 44 (processed as in FIG. 1(a2)) are symmetrically distributed among the Nb or Nb alloy rods 41. In a second extrusion shown in FIG. 3(b) the hex shaped rods 50 from the first extrusion are packed in a Cu—Sn can 51. A Cu stabilizer 45 is centered in the subelement and is surrounded by a diffusion barrier 46, as e.g. one of Ta. Note that the stabilizing Cu need not be placed at the composite center; alternatively the outer jacket of the composite could be Cu, separated from the Cu—Sn alloy by a diffusion barrier. Manufacturers presently achieve the high critical current density A15 material by doping the Nb filaments with Ta or doping the bronze matrix with Ti. With the present invention, one can use distributed Ti dopant source rods with Nb or Nb alloy rods in an undoped Cu—Sn matrix. This aids in cost and ease of fabrication. FIG. 3 thus shows how this is done for an internally stabilized double extrusion process. All one need do differently from the prior art method is distribute the Ti dopant source rods in the first extrusion design and, if needed, modify the heat treatment to ensure even Ti distribution.

The invention is further illustrated by the following Examples, which are to be considered exemplary and not delimitive of the invention otherwise set forth:

EXAMPLE 1

In this Example a wire was prepared using in the process subelements of the type shown in FIG. 1. The hex filament subelement design was thus used with a distributed reactable Nb diffusion barrier. It included three hot ($\geq 900°$ F.) extrusions.

First Extrusion—Monofilament copper clad hexes of Nb were manufactured by extruding a Nb ingot in a copper can and drawing the resulting rod to hex rods for restacking (FIG. 1a). Typical dimensions of a hex rod are 1/8 inch flat-to-flat×2 feet in length. Monofilament hexes of Nb47 wt % Ti were manufactured by extruding a Nb47 wt % Ti (with a Nb diffusion barrier) in a copper can and drawing the resulting rod to hex rods for restacking with the Nb rods (as in FIG. 1a).

Second Extrusion—Referring to the cross-sectional view in FIG. 1b, the rods from the first extrusion were restacked in a Nb alloy barrier tube. The Ti dopant source rods were arranged in a symmetrical uniformly spaced pattern among the stack of copper clad Nb or Nb alloy hexes. Only a few of the Nb47 wt % Ti rods were needed at the matrix of Nb hexes to obtain the 1–3 atomic percent desired for maximum $B_{c2}$, but they should be dispersed symmetrically and evenly through the restack to aid in even Ti diffusion. The elements thus far discussed were placed inside a copper can that was evacuated and welded before extrusion to form the subelement. The extruded subelement rods were drawn to a hexagonal cross section, gundrilled and packed with salt (FIG. 1c).

Figure 4:
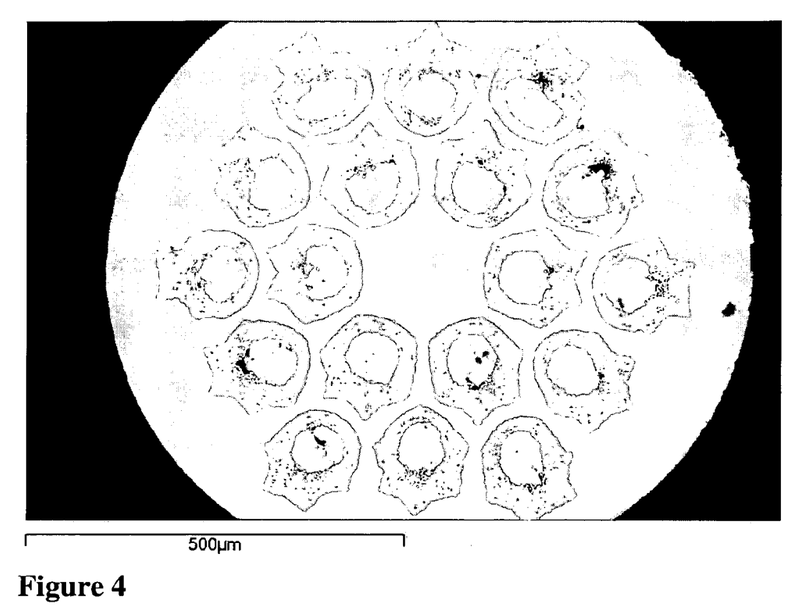
FIG. 4 is a photomicrograph for a cross-section of the reacted wire prepared by the method illustrated in FIG. 1.
Figure 5:
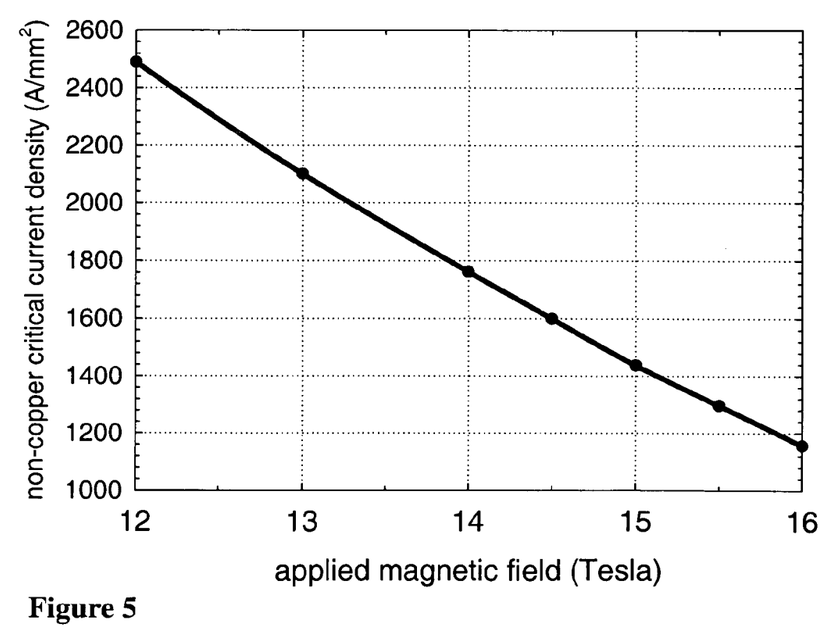
FIG. 5 is a graph showing non-copper critical current density vs. applied magnetic field for a reacted wire as in FIG. 4.

Third Extrusion—As in FIG. 1(d) eighteen of the subelement hex rods were restacked in a copper can that was evacuated and welded and extruded to 2 inch diameter rod. This third extrusion rod had the salt removed by washing with water, and was replaced with a Sn—Cu alloy (FIG. 1(d)), and then drawn to final size (0.8 mm diameter) and then reacted (see FIG. 4) using a typical internal tin heat treatment (210° C. for 100 hrs., 400° C. for 48 hrs., and 675° C. for 180 hrs). During the reaction stage both the filaments fully reacted and the titanium in the Nb47 wt % Ti rods dispersed throughout the conductor cross section. The evidence for this was threefold. First, the cross-sections showed that the filaments in the wire were nearly fully reacted. Second, the critical current density vs. applied magnetic field plot (FIG. 5) shows a critical current density and $B_{c2}$ (Kramer extrapolation=27T) of a magnitude that could not exist without successful doping by Ti. Third, cross sections of the unreacted and reacted wire were examined by SEM-EDS (energy dispersive spectrometry). Before reaction, it was confirmed that the Nb filaments were pure Nb and Nb—Ti filaments were ~47 wt % Ti. After reaction, all measured regions of reacted Nb filament and barrier showed (Nb, Ti)$_3$Sn where the Ti concentration was ~0.6 wt % Ti. The location where the Nb47 wt % Ti filaments were originally located revealed mostly copper, which is believed to have diffused to the location during the Ti diffusion. It shall be noted that because of this effect it should be possible to use Ti source filaments as internal separators of superconducting regions to reduce AC losses. X-ray line scans across the sample could find no gradient of Ti concentration, indicating even Ti distribution.

It shall also be noted that this rod was fabricated to final size without a single wire break, while a similar billet of the same size and similar design, except with Nb7.5 wt % Ta filaments and barrier had over a dozen wire breaks when fabricated to final size. This is believed to be because Nb is softer and is thus easier to co-draw with the copper and tin that make up the composite. Because the necessary high critical current density dopant was located in a few, ductile Nb47 wt % Ti rods, and not in the Nb filaments, Sn source or Cu matrix, excellent fabricability was achieved.

EXAMPLE 2

In this Example a wire was prepared using in the process subelements of the type shown in FIG. 2. The round filament subelement design was thus used with a single, non-reacting Ta diffusion barrier. It featured one ($\geq 900°$ F.) extrusion.

First Extrusion

Nb rods and Nb47 wt % Ti rods (dia. 0.54 inches) are packed in a gundrilled copper billet (dia. 12.25 inches, FIG. 2a) and this subelement was extruded to 3.1 inches. Monofilament rods of Nb47 wt % Ti were manufactured in a similar manner to that described in Example 1.

This subelement was gundrilled and packed with tin, wiredrawn and shaped at restacking size.

Restack

Figure 6:
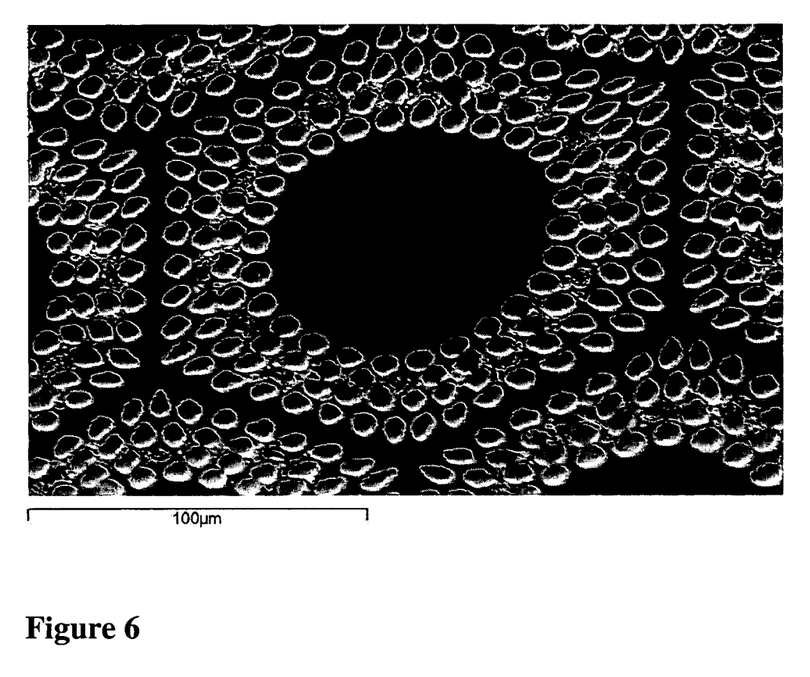
FIG. 6 is a photomicrograph for a cross-section of the reacted wire prepared by the method illustrated in FIG. 2.
Figure 7:
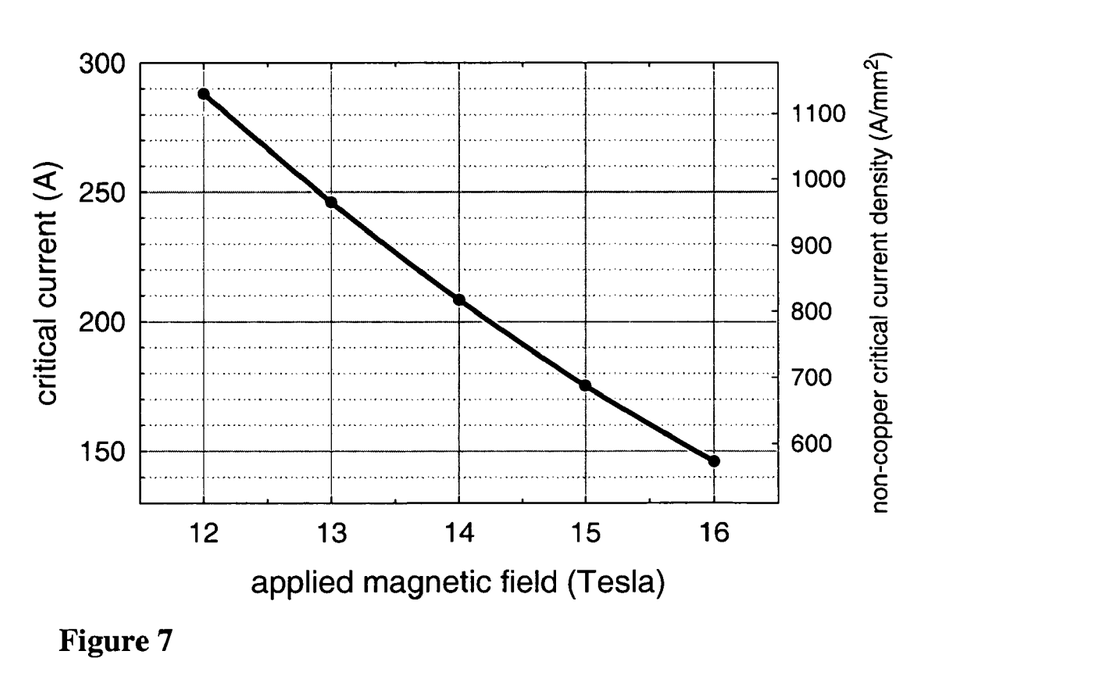
FIG. 7 is a graph showing non-copper critical current density vs. applied magnetic field for a reacted wire as in FIG. 5.
Figure 8:
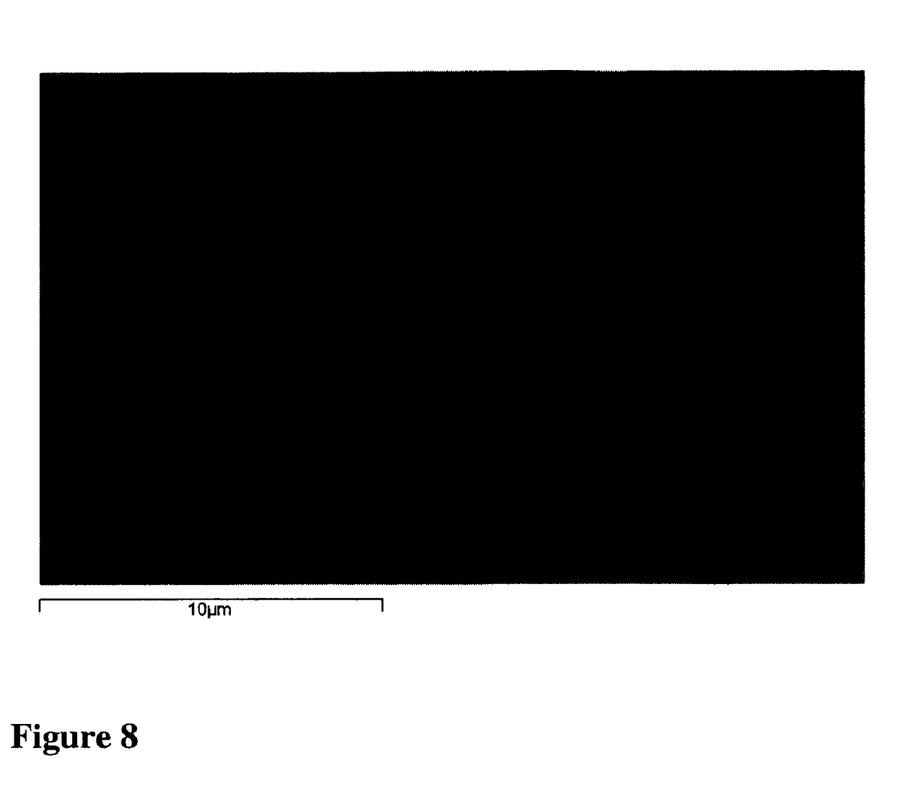
FIG. 8 is an SEM/EDS photomicrograph for a cross-section of the reacted wire prepared by the method illustrated in FIG. 2.

The subelement shapes were packed in a Ta barrier in a Cu tube and drawn to final size (0.81 mm diameter). The wire was reacted (FIG. 6) using a typical internal tin heat treatment (210° C. for 48 hrs., 400° C. for 48 hrs., and 675° C. for 100 hrs). During the reaction stage both the filaments fully reacted and the titanium in the Nb47 wt % Ti rods dispersed throughout the conductor cross section. The evidence for this was threefold. First, the cross-sections showed that the filaments in the wire were nearly fully reacted. Second, the critical current-density vs. applied magnetic field plot (FIG. 7) shows a critical current density and $B_{c2}$ (Kramer extrapolation=29T) of a magnitude that could not exist without successful doping by Ti. Third, cross sections of the unreacted and reacted wire were examined by SEM EDS (energy dispersive spectrometry). Before reaction, it was confirmed that the Nb filaments were pure Nb and Nb—Ti filaments were ~47 wt % Ti. After reaction, all measured regions of reacted Nb filament showed (Nb, Ti)$_3$Sn where the Ti concentration was ~1.0 wt % Ti. The location where the Nb—Ti filaments were originally located revealed mostly Nb, Sn, and Cu. The % of Ti has dropped from about 63 at wt % to about 8 at wt %, indicating Ti diffusion away from the site. The Cu and Sn appear to have diffused to the location during the Ti diffusion (FIG. 9). X-Ray line scans across the filaments could find no gradient of Ti concentration, indicating even Ti distribution.

While the present invention has been described in terms of specific embodiments thereof, it will be understood in view of the present disclosure, that numerous variations upon the invention are now enabled to those skilled in the art, which variations yet reside within the scope of the present teaching. Accordingly, the invention is to be broadly construed, and limited only by the scope and spirit of the claims now appended hereto.

What is claimed is:

1. A method for producing a multifilament (Nb, Ti)$_3$Sn superconducting wire comprising the steps of:
    a) packing a plurality of Nb or Nb alloy rods within a copper containing matrix to form a packed subelement for said superconducting wire;
    b) packing Ti dopant source rods amongst the Nb or Nb alloy rods in the copper containing matrix;
    c) providing sources of Sn accessible for diffusion into the Nb or Nb alloy rods;
    d) assembling said subelements within a further copper containing matrix,
    e) reducing said assemblage from step d) to wire form; and
    f) diffusing the said Sn and said Ti into the Nb or Nb alloy rods to form (Nb, Ti)$_3$Sn.

2. A method in accordance with claim 1 wherein in step a) said Nb or Nb alloy rods are ensheathed in a copper or copper alloy.

3. A method in accordance with claim 1, wherein said Ti dopant source rods comprise Ti or Ti alloy rods in copper or copper alloy sheaths.

4. A method in accordance with claim 3, wherein a Nb diffusion barrier is provided between the Ti or Ti alloy rod and the copper sheath.

5. A method in accordance with claim 3 wherein the number of said Ti dopant source rods is small compared to the number of said Nb or Nb alloy rods.

6. A method in accordance with claim 5 wherein said Ti dopant source rods are symmetrically distributed among the said Nb or Nb alloy rods.

7. A method in accordance with claim 1, wherein the Sn is diffused into said Nb or Nb alloy rods by an internal Sn process.

8. A method in accordance with claim 7, wherein said Sn sources are within said subelements.

9. A method in accordance with claim 7, wherein said Sn sources are adjacent to said subelements.

10. A method in accordance with claim 7, wherein the extruded subelement from step (d) are gundrilled and the resulting holes filled with said Sn or Sn alloy.

11. A method in accordance with claim 10, wherein the totality of the subelements are surrounded by a single diffusion barrier.

12. A method in accordance with claim 1, wherein the Sn is diffused into said Nb or Nb alloy rods by the bronze process.

13. A method in accordance with claim 10, where each subelement has a diffusion barrier.

14. A method in accordance with claim 10 wherein the extruded subelements from step (1d) are gundrilled, filled with salt, restacked, extruded again, and the salt replaced with Sn or Sn alloy.

15. A method in accordance with claim 2, wherein the encased Nb or Nb alloy rods are formed into hexed cross sectioned rods for use in packing the subelement.

16. A method in accordance with claim 3, wherein the Ti dopant source rods are formed into a hexagonal cross section to enable their packing among the hexed Nb or Nb alloy rods.

17. A method in accordance with claim 1, wherein in step (d) the subelements are hexed in cross-section.

18. A method in accordance with claim 1, wherein in step (a) the Nb or Nb alloy rods are emplaced at holes drilled in said matrix.

19. A method in accordance with 18 wherein said matrix comprises Cu—Sn alloy.

20. A method in accordance with 18 wherein said matrix comprises Cu.

21. A method in accordance with claim 18, wherein said Ti dopant source rods are inserted at further holes drilled in said matrix.

22. A method in accordance with claim 5, wherein said Ti dopant source rods are placed strategically in the subelement to separate superconducting regions to reduce the effective filament diameter and AC losses.

* * * * *